US012706169B2

(12) United States Patent
Krishnamoorthy et al.

(10) Patent No.: US 12,706,169 B2
(45) Date of Patent: Aug. 11, 2026

(54) DATA STORAGE DEVICE HAVING A MEMORY BLOCK FAILURE ANTICIPATION SYSTEM

(71) Applicant: Sandisk Technologies, Inc., Milpitas, CA (US)

(72) Inventors: Yuvaraj Krishnamoorthy, San Jose, CA (US); Jayavel Pachamuthu, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 83 days.

(21) Appl. No.: 18/954,273

(22) Filed: Nov. 20, 2024

(65) Prior Publication Data

US 2026/0141966 A1 May 21, 2026

(51) Int. Cl.
*G11C 16/34* (2006.01)
*G11C 16/08* (2006.01)
*G11C 16/26* (2006.01)

(52) U.S. Cl.
CPC .......... *G11C 16/3495* (2013.01); *G11C 16/08* (2013.01); *G11C 16/26* (2013.01)

(58) Field of Classification Search
CPC .................................................. G11C 16/3495
USPC ..................................................... 365/185.09
See application file for complete search history.

(56) References Cited

U.S. PATENT DOCUMENTS

2013/0145085 A1 6/2013 Yu et al.
2024/0038313 A1* 2/2024 Wei .................... G11C 29/4401
2025/0201333 A1* 6/2025 Won ....................... G11C 16/08

FOREIGN PATENT DOCUMENTS

KR 20180085107 A 7/2018

* cited by examiner

*Primary Examiner* — Anthan Tran
(74) *Attorney, Agent, or Firm* — DENTONS Durham Jones Pinegar

(57) ABSTRACT

A data storage device includes a memory block failure anticipation system. The memory block failure anticipation system proactively detects defects in wordlines and/or memory blocks of the data storage device. To determine the presence of defects, the memory block failure anticipation system determines a failed bit count associated with one or more wordlines of a selected memory block and/or a failed bit count associated with the memory block. The failed bit count is compared against two thresholds—a block level data loss threshold and a wordline level data loss threshold. If the failed bit count exceeds the block level data loss threshold, the memory block is retired. If the failed bit count exceeds the wordline level data loss threshold but not the block level data loss threshold, a particular wordline of the memory block is retired and/or the memory block is retired.

20 Claims, 9 Drawing Sheets

225 230 235 240

270

| P0 | P0 | P0 | P0 |
|---|---|---|---|
| P1 | P1 | P1 | P1 |
| P2 | P2 | P2 | P2 |
| P3 | P3 | P3 | P3 |
| P4 | P4 | P4 | P4 |
| PN | PN | PN | PN |

DATA STORAGE DEVICE HAVING A MEMORY BLOCK FAILURE ANTICIPATION SYSTEM

BACKGROUND

A data storage device typically includes a number of memory dies and each memory die includes multiple different memory blocks. The memory blocks are comprised of various memory cells organized as NAND strings. Each NAND string is coupled or connected to a number of different wordlines, bit lines and a source line. However, overtime, the contacts or connection points between a NAND string and a wordline and/or the contacts or connection points between a NAND string and the source line may begin to fail.

For example, due to various stresses, such as stresses caused by multiple program/erase (P/E) cycles, the contacts or connection points between wordlines and NAND strings, and between NAND strings and source lines, may begin to wear out. If the contacts or connection points between the NAND strings, the wordlines and/or the source lines fail, data stored in the wordlines and/or the memory block will become corrupted and/or be lost.

Accordingly, it would be beneficial to anticipate whether contacts or connection points between wordlines, NAND strings and/or source lines of a memory block are at risk of failing which would reduce or eliminate the possibility of stored data becoming lost or corrupted.

SUMMARY

The present disclosure describes a data storage device, such as a NAND data storage device, having a memory block failure anticipation system. The memory block failure anticipation system is configured to proactively detect defects in wordlines and/or memory blocks of the data storage device. When the memory block failure anticipation system detects a defect, the memory block failure anticipation system retires the wordlines and/or the memory blocks from further use at a system level.

Defects in a memory block and/or wordline may be the result of a variety of different factors. For example, as wordlines and/or memory blocks of the data storage device are subjected to cycling stresses (e.g., program/erase (P/E) cycling stresses), the wordlines and/or memory blocks may begin to wear out. In some examples, the contacts or connection points between a NAND string and a wordline of the memory block may begin to fail. In other examples, contacts or connection points between a source line of a memory block and one or more NAND strings may begin to fail (e.g., a channel remains open such that none of the wordlines in the memory block can be read). If these contacts or connection points ultimately fail, any data stored in the wordlines and/or the memory block may become corrupted and/or lost.

To determine whether a memory block and/or a wordline is failing, the memory block failure anticipation system periodically and proactively performs a health check on a memory block and/or on one or more wordlines of a particular memory block of the data storage device. For example, the memory block failure anticipation system selects a particular memory block from a pool of available memory blocks and determines a number of P/E cycles the memory block has been subjected to. In another example, the memory block failure anticipation system performs the health check when data will be written to a selected memory block. For example, the memory block failure anticipation system will perform the health check once a selected memory block is erased and prior to the memory block being programmed.

If the memory block has been subjected to over a threshold number of P/E cycles, the memory block failure anticipation system initiates the health check. In an example, the health check includes initiating an erase operation on the selected memory block to set all values in each memory cell of the memory block to a logical "1". The memory block failure anticipation system then applies a read voltage to all of the wordlines of the memory block.

The memory block failure anticipation system also counts all of the logical "1's" read from each wordline to determine a failed bit count (e.g., memory cells that are not storing a logical "1") of the wordline and/or a of the memory block. If the number of failed bits, or the failed bit count, is above a first state threshold (e.g., greater than 255 b/1K), the memory block is marked as a bad block (or a grown bad block) and is retired. However, if the number of failed bits is below the first state threshold but greater than a second state threshold (e.g., 56 b/1K), that particular wordline is marked as a bad wordline and is retired. In another example, a memory block associated with the failed wordline may be retired, either in lieu of the wordline, or along with the wordline. This process is repeated for another wordline in the memory block.

Once all of the wordlines in the memory block have been selected and tested, and if the number of failed bits is still below the first state threshold and the second state threshold, the memory block is available for use. However, if the number of failed bits from one or more of the wordlines is greater than the first state threshold, the memory block associated with the wordline and/or the wordline itself, is retired. Otherwise, the memory block is made available for subsequent operations.

Accordingly, examples of the present disclosure describe a method that includes selecting a memory block from a pool of free memory blocks and initiating an erase operation on the memory block. A determination is made as to whether a P/E cycle count for the memory block exceeds a P/E cycle threshold. In response to determining the P/E cycle count for the memory block exceeds the P/E cycle threshold, a read operation is performed on a first wordline of a plurality of wordlines of the memory block. A determination is then made as to whether each memory cell associated with the first wordline is in a first state or a second state. A determination is also made regarding whether a number of memory cells in the first state exceeds a first state threshold. In response to determining the number of memory cells in the first state exceeds the first state threshold, the memory block is marked as a failed memory block. However, if it is determined that the number of memory cells in the first state is less than the first state threshold, a determination is made regarding whether the number of memory cells in the first state exceeds a second state threshold. In response to determining that the number of memory cells in the first state exceeds the second state threshold, the first wordline is marked as a failed wordline. This process may be repeated for each physical wordline or until the first state threshold is exceeded.

The present disclosure also describes a data storage device that includes a controller and a memory block failure anticipation system. In an example, the memory block failure anticipation system initiates an erase operation on a selected memory block and determines whether a P/E cycle count for the selected memory block exceeds a P/E cycle threshold. If the memory block failure anticipation system determines that the P/E cycle count for the selected memory block exceeds the P/E cycle threshold, the memory block failure anticipation system determines whether each memory cell associated with a first wordline of the selected memory block is in a first state and determines whether a number of memory cells associated with the first wordline of the selected memory block in the first state exceeds a first state threshold. In response to determining that the number of memory cells associated with the first wordline of the selected memory block in the first state exceeds the first state threshold, the memory block failure anticipation system marks the selected memory block as a failed memory block. However, if the memory block failure anticipation system determines that the number of memory cells associated with the first wordline of the selected memory block in the first state is less than the first state threshold, the memory block failure anticipation system determines whether the number of memory cells associated with the first wordline of the selected memory block in the first state exceeds a second state threshold. If the memory block failure anticipation system determines that the number of memory cells associated with the first wordline of the selected memory block in the first state exceeds the second state threshold, the first wordline is marked as a failed wordline. This process may be repeated for each wordline in the memory block.

Still other examples describe a data storage device that includes means for determining whether a P/E cycle count for a memory block selected for an erase operation exceeds a P/E cycle threshold. The data storage device also includes means for determining whether each memory cell associated with a first wordline of the selected memory block is in a first state and means for determining whether a number of memory cells associated with the first wordline of the selected memory block in the first state exceeds a first state threshold. The data storage device also includes means for marking the selected memory block as a failed memory block in response to a determination that the P/E cycle count for the selected memory block exceeds the P/E cycle threshold and means for determining whether the number of memory cells associated with the first wordline of the selected memory block in the first state exceeds a second state threshold. In an example, the data storage device also includes means for marking the first wordline as a failed wordline in response to a determination that the number of memory cells associated with the first wordline of the selected memory block in the first state exceeds the second state threshold.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

Figure 1:
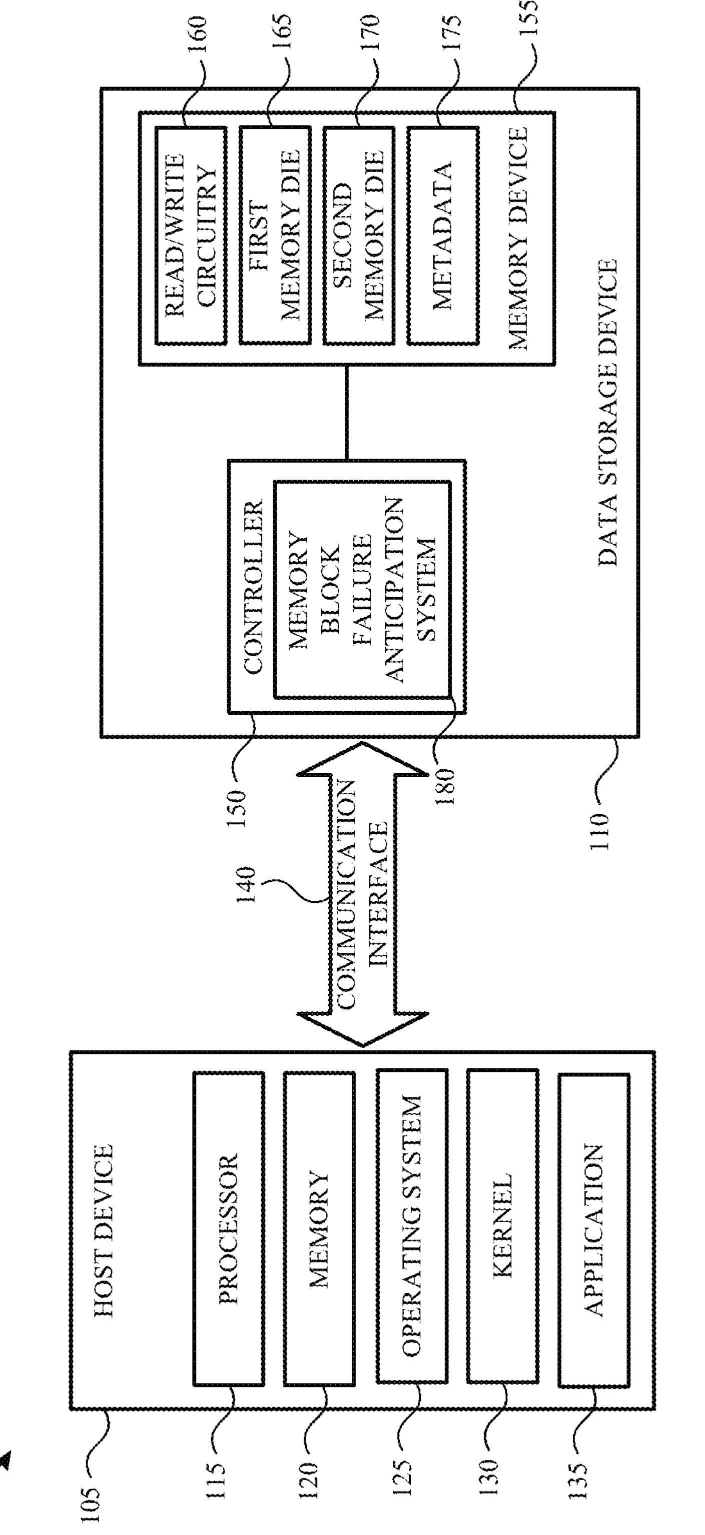
FIG. 1 is a block diagram of a system that includes a host device and a data storage device according to an example.

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. The following detailed description is therefore not to be taken in a limiting sense, and the scope of the present disclosure is defined by the appended claims and their equivalents.

A data storage device typically includes a number of memory dies and each of the memory dies include multiple different memory blocks. The memory blocks are comprised of various memory cells organized as NAND strings (also referred to as memory holes). Each NAND string is coupled or connected to a number of different wordlines and a source line. However, overtime, the contacts or connection points between a NAND string and a wordline and/or between a NAND string and the source line may begin to fail.

For example, due to various stresses, such as stresses caused by multiple program/erase (P/E) cycles or other factors, the contacts or connection points between the NAND string and the wordlines and/or the source line may begin to fail. This issue may become more exacerbated as a thickness of various signal lines or channels of the memory die get smaller. As these contacts or connection points fail, data stored in the memory block and/or in a wordline may become corrupted or lost.

To address the above, the present disclosure describes a memory block failure anticipation system for a data storage device. In an example, the memory block failure anticipation system proactively detects defects in wordlines and/or memory blocks of the data storage device. When the memory block failure anticipation system detects a defect, the memory block failure anticipation system retires the wordlines and/or the memory blocks from further use.

To determine whether a memory block and/or a wordline is failing, the memory block failure anticipation system periodically performs a health check on a particular memory block and/or on one or more wordlines of the particular memory block of the data storage device. For example, the memory block failure anticipation system selects the particular memory block from a pool of available memory blocks and determines a number of P/E cycles the memory block has been subjected to.

If the memory block has been subjected to over a threshold number of P/E cycles, the memory block failure anticipation system initiates the health check. In another example, the memory block failure anticipation system performs the health check when data will be written to a selected memory block. For example, the memory block failure anticipation system will perform the health check once a selected memory block is erased and prior to the memory block being programmed. In an example, the health check includes initiating an erase operation on the selected memory block to set all values in each memory cell of the memory block to a logical "1". The memory block failure anticipation system then performs a read operation on all of the wordlines of the memory block in series or in sequence.

The memory block failure anticipation system determines a state of each memory cell of the memory block. For example, the memory block failure anticipation system determines whether each memory cell of a particular wordline is storing a logical "1" or a logical "0". Based on the count of logical "1's", the memory block failure anticipation system determines the number of failed bits (or a failed bit count) of the wordline and/or the memory block.

If the number of failed bits is above a first state threshold, the memory block is marked as a grown bad block and is retired. However, if the number of failed bits is below the first state threshold but greater than a second state threshold, the memory block failure anticipation system marks that particular wordline as a bad wordline and the wordline is retired. In an example, the memory block failure anticipation system may also mark the memory block as a bad memory block. In such examples, the data from the memory block is retrieved, corrected and stored in another memory block.

However, if the number of failed bits is below the first state threshold and the second state threshold, the memory block is available for use. This process repeats for each wordline in the memory block and/or for each memory block of a memory die—once the memory blocks have been placed in a free memory block pool.

In accordance with the above, many technical benefits may be realized including, but not limited to, reducing or eliminating the risk of data loss and/or corruption due to grown bad blocks and increasing a reliability of memory dies and the data storage device by proactively identifying blocks that will grow bad and retiring the memory blocks before data becomes corrupted.

These benefits, along with other examples, will be shown and described in greater detail with respect to FIG. 1-FIG. 6.

FIG. 1 is a block diagram of a system 100 that includes a host device 105 and a data storage device 110 according to an example. In an example, the host device 105 includes a processor 115 and a memory 120 (e.g., main memory). The memory 120 may include or otherwise be associated with an operating system 125, a kernel 130 and/or an application 135.

The processor 115 can execute various instructions, such as, for example, instructions from the operating system 125 and/or the application 135. The processor 115 may include circuitry such as a microcontroller, a Digital Signal Processor (DSP), an Application-Specific Integrated Circuit (ASIC), a Field Programmable Gate Array (FPGA), hardwired logic, analog circuitry and/or various combinations thereof. In an example, the processor 115 may include a System on a Chip (SoC).

In an example, the memory 120 can be used by the host device 105 to store data used, or otherwise executed by, the processor 115. Data stored in the memory 120 may include instructions provided by the data storage device 110 via a communication interface 140. The data stored in the memory 120 may also include data used to execute instructions from the operating system 125 and/or one or more applications 135. The memory 120 may be a single memory or may include multiple memories, such as, for example one or more non-volatile memories, one or more volatile memories, or a combination thereof.

In an example, the operating system 125 may create a virtual address space for the application 135 and/or other processes executed by the processor 115. The virtual address space may map to locations in the memory 120. The operating system 125 may also include or otherwise be associated with a kernel 130. The kernel 130 may include instructions for managing various resources of the host device 105 (e.g., memory allocation), handling read and write requests and so on.

The communication interface 140 communicatively couples the host device 105 and the data storage device 110. The communication interface 140 may be a Serial Advanced Technology Attachment (SATA), a PCI express (PCIe) bus, a Small Computer System Interface (SCSI), a Serial Attached SCSI (SAS), Ethernet, Fibre Channel, or Wi-Fi. As such, the host device 105 and the data storage device 110 need not be physically co-located and may communicate over a network such as a Local Area Network (LAN) or a Wide Area Network (WAN), such as the internet. In addition, the host device 105 may interface with the data storage device 110 using a logical interface specification such as Non-Volatile Memory express (NVMe) or Advanced Host Controller Interface (AHCI).

The data storage device 110 includes a controller 150 and a memory device 155. The controller 150 is communicatively coupled to the memory device 155. In an example, the memory device 155 includes one or more memory dies (e.g., first memory die 165 and second memory die 170). Although memory dies are specifically mentioned, the memory device 155 may include semiconductor dies, any non-volatile memory device, storage device, storage elements or storage medium including NAND flash memory cells and/or NOR flash memory cells.

The memory cells can take the form of solid-state (e.g., flash) memory cells and can be one-time programmable, few-time programmable, or many-time programmable. Additionally, the memory cells may be single-level cells (SLCs), multi-level cells (MLCs), triple-level cells (TLCs), quad-level cells (QLCs), penta-level cells (PLCs), and/or use any other memory technologies. The memory cells may be arranged in a two-dimensional configuration or a three-dimensional configuration.

In an example, the data storage device 110 is attached to or embedded within the host device 105. In another example, the data storage device 110 is implemented as an external device or a portable device that can be communicatively or selectively coupled to the host device 105. In yet another example, the data storage device 110 is a component (e.g., a solid-state drive (SSD)) of a network accessible data storage system, a network-attached storage system, a cloud data storage system, or the like.

As indicated above, the memory device 155 of the data storage device 110 includes a first memory die 165 and a second memory die 170. Although two memory dies are shown, the memory device 155 may include any number of memory dies (e.g., one memory die, two memory dies, eight memory dies, or another number of memory dies).

The memory device 155 also includes support circuitry. In an example, the support circuitry includes read/write circuitry 160. The read/write circuitry 160 supports the operation of the memory dies of the memory device 155. Although the read/write circuitry 160 is depicted as a single component, the read/write circuitry 160 may be divided into separate components, such as, for example, read circuitry and write circuitry. The read/write circuitry 160 may be external to the memory dies of the memory device 155. In another example, one or more of the memory dies includes corresponding read/write circuitry 160 that is operable to read data from and/or write data to storage elements within one individual memory die independent of other read and/or write operations on any of the other memory dies.

In an example, one or more of the first memory die 165 and the second memory die 170 include one or more memory blocks. Each memory block includes one or more memory cells. A block of memory cells is the smallest number of memory cells that are physically erasable together. In an example and for increased parallelism, each of the blocks may be operated or organized in larger blocks or metablocks. For example, one block from different planes of memory cells may be logically linked together to form a metablock.

Figures 2A, 2B:
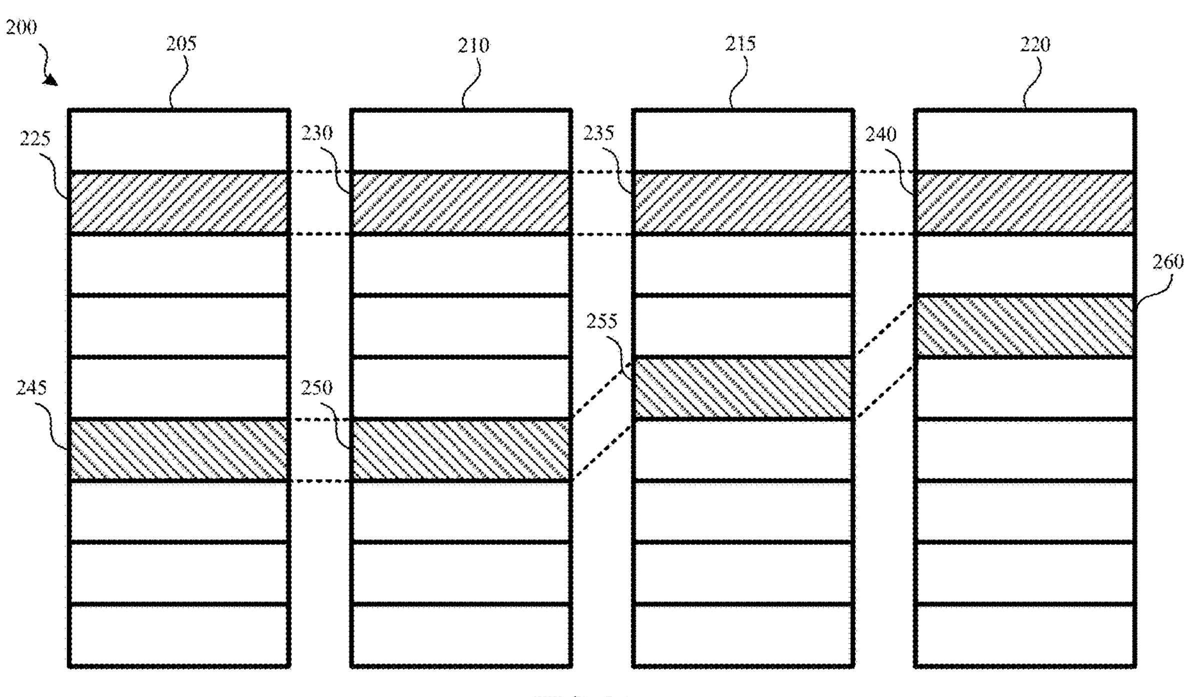
FIG. 2A illustrates how a memory die includes a number of memory blocks according to an example.
FIG. 2B illustrates how a memory block includes one or more pages according to an example.

For example and referring to FIG. 2A, a memory device 200 (e.g., a storage element, a memory die, a non-volatile memory device) includes four planes or sub-arrays (e.g., a first plane 205, a second plane 210, a third plane 215, and a fourth plane 220). In an example, the planes are integrated on a single memory die, are provided on two different memory dies (e.g., two planes on each memory die) or are provided on four separate memory dies. Although four planes are shown and described, the memory device 200 may have any number of planes and/or memory dies.

In an example, the planes are divided into memory blocks consisting of memory cells. As shown in FIG. 2A, the rectangles represent each memory block, such as memory block 225, memory block 230, memory block 235 and memory block 240. There may be dozens or hundreds of memory blocks in each plane of the memory device 200. In an example, each memory block is a unit of erase and is sometimes referred to as an erase block. For example, memory block 225, memory block 230, memory block 235 and memory block 240 include a minimum number of memory cells that are erased together.

In addition, various memory blocks may be logically linked or grouped together (e.g., using a table in or otherwise accessible by the controller 150) to form a metablock. A metablock may be written to, read from and/or erased as a single unit. For example, memory block 225, memory block 230, memory block 235 and memory block 240 may form a first metablock while memory block 245, memory block 250, memory block 255 and memory block 260 may form a second metablock. The memory blocks used to form a metablock need not be restricted to the same relative locations within their respective planes.

In an example, each memory block may be divided, for operational purposes, into pages of memory cells, such as illustrated in FIG. 2B. For example, the memory cells of memory block 225, memory block 230, memory block 235 and memory block 240 are divided into N different pages (shown as P0-PN). Although a specific number of pages are shown in FIG. 2B, a memory block may have any number of pages of memory cells within each memory block.

A page is a unit of data programming within the memory block. Each page includes the minimum amount of data that can be programmed at one time. The minimum unit of data that can be read at one time may be less than a page. A metapage 270 is illustrated in FIG. 2B as being formed of one physical page from memory block 225, memory block 230, memory block 235 and memory block 240. In the example, shown, the metapage 270 includes page P1 in each of the four memory blocks. However, the pages of the metapage 270 need not have the same relative position within each of the memory blocks. A metapage 270 may be the maximum unit of programming within a memory block.

The memory blocks disclosed in FIG. 2A-FIG. 2B are referred to herein as physical memory blocks because they relate to groups of physical memory cells as discussed above. As used herein, a logical memory block is a virtual unit of address space defined to have the same size as a physical memory block. Each logical memory block includes a range of logical memory block addresses (LBAs) that are associated with data received from a host. The LBAs are then mapped to one or more physical memory blocks in the data storage device 110 where the data is physically stored.

Figure 2C:
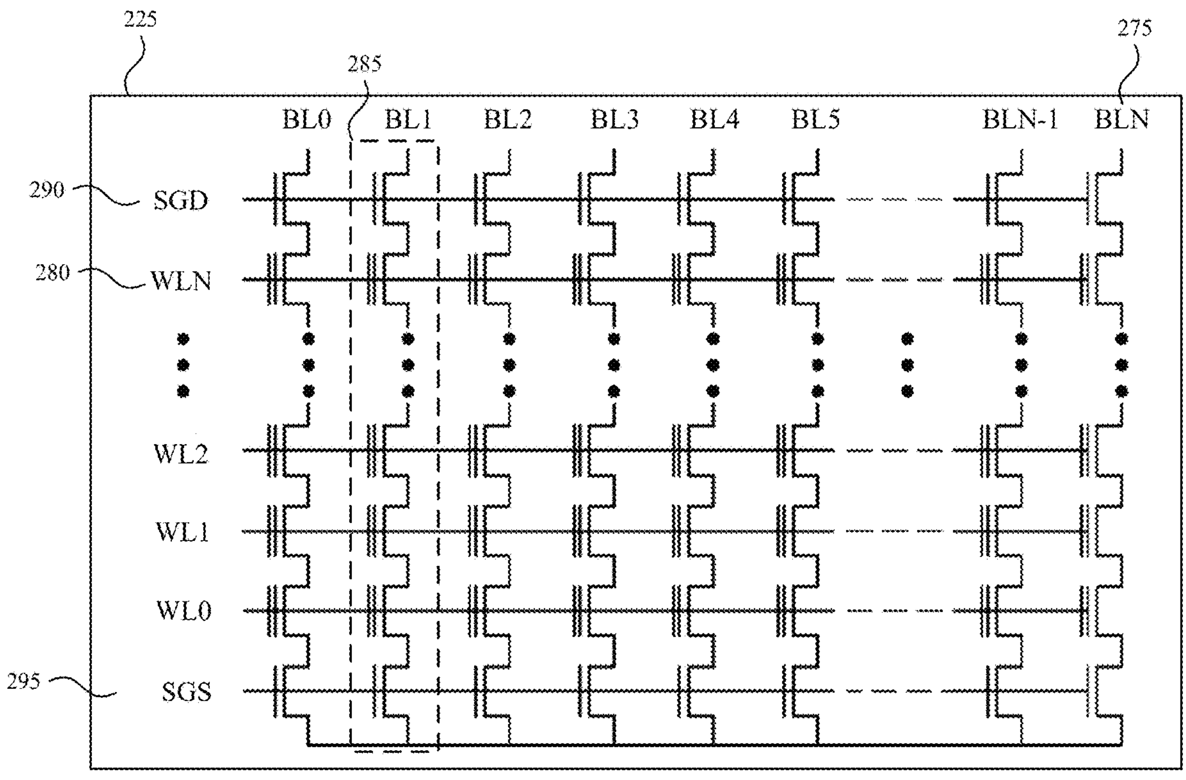
FIG. 2C illustrates how a memory block includes a number of memory cells according to an example.

As previously discussed, each memory block includes any number of memory cells. The design, size, and organization of a memory block may depend on the architecture, design, and application desired for each memory die. In an example, the memory block includes a contiguous set of memory cells that share a plurality of wordlines and bit lines. For example and as shown in FIG. 2C, the memory block 225 includes bit lines BL0-BLN (collectively bit lines 275), where N is a total number of bit lines. Additionally, the memory block 225 includes wordlines WL0-WLN (collectively wordlines 280), where N is a total number of wordlines. In an example, multiple memory blocks can share the same bit line.

A wordline 280 may function as a single-level-cell (SLC) wordline, a multi-level-cell (MLC) wordline, a tri-level-cell (TLC) wordline, a quad-level cell (QLC) wordline, a penta-level cell (PLC) wordline and so on. Additionally, each memory cell may be programmable to a particular state (e.g., a threshold voltage in a flash configuration or a resistive state in a resistive memory configuration) that indicates one or more values.

In the example shown in FIG. 2C, four memory cells are connected in series to form a NAND string 285. Although four memory cells are depicted, the NAND string 285 can include any number of memory cells (e.g., 16, 32, 64, 128, 256 or any other number or memory cells). One terminal of the NAND string 285 is connected to a corresponding bit line via a drain select gate or a select gate drain line (SGD) 290. Another terminal of the NAND string 285 is connected to a source line via a source select gate or a select gate source line (SGS) 295. Additionally, although eight bit lines 275 are shown in FIG. 2C, a memory block 225 may have any number of bit lines 275.

Referring back to FIG. 1 and as previously described, the data storage device 110 also includes a controller 150. Although a single controller 150 is shown and described, the data storage device 110 can include multiple controllers. In such an example, a first controller executes a first operation or set of operations and the second controller executes a second operation or set of operations. In an example, the first set of operations and the second set of operations are executed on the same memory dies. In other examples, the first set of operations is executed on a first memory die or a first set of memory dies and the second set of operations is executed on a second memory die or a second set of memory dies.

The controller 150 is communicatively coupled to the memory device 155 via an input/output (I/O) bus, an interface, or other communication circuitry. In an example, the communication circuitry includes one or more channels to enable the controller 150 to communicate with the first memory die 165 and/or the second memory die 170 of the memory device 155. In another example, the communication circuitry includes multiple distinct channels which enables the controller 150 to communicate with the first memory die 165 independently and/or in parallel with the second memory die 170 of the memory device 155.

The controller 150 receives data and/or instructions from the host device 105. The controller 150 also sends data to the host device 105. For example, the controller 150 sends data to and/or receives data from the host device 105 via the communication interface 140. The controller 150 also sends data and/or commands to, and/or receive data from, the memory device 155.

The controller 150 sends data and a corresponding write command to the memory device 155 to cause the memory device 155 to store data at a specified address of the memory device 155. The controller 150 also sends data and/or commands associated with one or more background scanning operations, garbage collection operations, and/or wear leveling operations.

The controller 150 also sends one or more read commands to the memory device 155. In an example, the read command specifies the physical address of a portion of the memory device 155 at which the data is stored. The controller 150 may also track the number of program/erase (P/E) cycles or other programming operations that have been performed on or by the memory device and/or the memory dies of the memory device 155.

The controller 150 also includes, or is otherwise associated with, a memory block failure anticipation system 180. In an example, the memory block failure anticipation system 180 is a packaged functional hardware unit designed for use with other components/systems. In another example, the memory block failure anticipation system 180 is a portion of a program code (e.g., software or firmware) executable by a processor or processing circuitry. In yet another example, the memory block failure anticipation system 180 is a self-contained hardware and/or software component that interfaces with other components and/or systems. Although the memory block failure anticipation system 180 is shown as being part of the controller 150, the memory block failure anticipation system 180 may be separate from the controller 150.

In an example, the memory block failure anticipation system 180 is operable, along with the controller 150, to determine whether one or more memory blocks and/or wordlines of the one or more of the memory dies have defects, are defective or have grown bad. For example, the memory block failure anticipation system 180 periodically initiates a health check or a status check on various memory blocks associated with the first memory die 165 and/or the second memory die 170 to determine whether certain defects have arisen due to various stresses the wordlines and/or memory blocks are subject to.

For example, memory blocks of various memory dies may wear out over time due to P/E cycling stresses and/or underlying defects from process manifestations. If these defects go undetected, the data stored by the memory block may become lost or corrupted and/or the entire memory block may be lost.

To address the above, the memory block failure anticipation system 180 checks for two different failure mechanisms that may arise due, for example, to various stresses that occur as a result of P/E cycles (or other stresses). For example, the memory block failure anticipation system 180 checks for wordline data loss (e.g., data loss caused by failures between contacts between a wordline and a NAND string (or a memory hole)) and for block level data loss (e.g., data loss caused by failures between contacts between a source line and a NAND string (or memory hole)).

Wordline data loss may occur due to a number of different factors. For example, as a channel thickness continues to be reduced, the channel is more susceptible to damage. Channel thickness may also vary in the NAND string due to manufacturing processes intrinsic or extrinsic variabilities, and vary between the blocks, planes and/or dies. In another example, trapped or residual elements (e.g., Fluorine) in the wordlines associated with the NAND string may migrate to a NAND string and damage the blocking oxide between the NAND string and the wordline. Although specific examples are given, wordline data loss may occur due to other factors.

Likewise, block level data loss is manifest with more cycling stresses. For example, due to cycling stresses, contacts between a NAND string and a source line may remain open. As a result, wordlines associated with the memory block cannot be read.

In an example, the memory block failure anticipation system 180 detects for the two type of failures when a memory block has been selected for, or is undergoing, an erase operation. For example, the memory block failure anticipation system 180 selects a particular memory block from a pool of available memory blocks. Before, after, or as part of the erase operation, the memory block failure anticipation system 180 checks the number of P/E cycles the particular memory block has been subjected to.

In an example, the number of P/E cycles for each memory block is stored as metadata 175. Although specific information is described, the metadata 175 also includes whether one or more memory blocks of the memory dies have been identified and/or marked as grown bad. Although specific examples are given, the metadata 175 may include additional information.

The memory block failure anticipation system 180 compares the number of P/E cycles of the memory block to a threshold number of P/E cycles. In an example, the threshold is three hundred P/E cycles or more. In another example, the threshold is five hundred P/E cycles or more. Although a specific number is given, the threshold number of P/E cycles may be any number. In other examples, the threshold number of P/E cycles may dynamically change based on one or more factors.

For example, the threshold number of P/E cycles may be based on a number of times the memory block failure anticipation system 180 has executed the health check on a particular memory block. As the number of health checks increases, the lower the threshold number of P/E cycles. In another example, the threshold number of P/E cycles may be based on a type of data stored in the memory block, whether the memory block is a SLC memory block, a MLC memory block, on an anticipated or expected lifetime of the memory block and so on.

If the memory block failure anticipation system 180 determines that the selected memory block has been subjected to fewer than the threshold number of P/E cycles, the erase operation continues as normal. However, if the memory block failure anticipation system 180 determines that the memory block has been subjected to more than the threshold number of P/E cycles, the memory block failure anticipation system 180 continues with the health check and issues an erase command in order to set the value of all the memory cells in the particular block to a logical “1”.

The memory block failure anticipation system 180 also issues or initiates a read command on the selected memory block. For example, the memory block failure anticipation system 180 initiates or executes an open read sequence which applies a read voltage (e.g., eight volts) to all the wordlines of the selected memory block (e.g., in sequence).

The memory block failure anticipation system 180 then checks or counts the number of logical "1's" that are stored by the memory cells associated with a first wordline of the memory block. For example, the memory block failure anticipation system 180 issues or executes a read command and performs a fail bit count (FBC) check on the first wordline (and subsequently on every physical wordline) to determine a state of each memory cell (e.g., whether a particular memory cell is storing a logical "1" or a logical "0") associated with the wordline.

The memory block failure anticipation system 180 uses the determined state of each memory cell of the first wordline to determine the number of failed bits (or a failed bit count) associated with the first wordline. The memory block failure anticipation system 180 then compares the number of failed bits to a first state threshold. In an example, the first state threshold is a block level data loss threshold. In an example, the first state threshold is a failure rate of 255 bits/1 k sectors, although other thresholds may be used. If the memory block failure anticipation system 180 determines that the number of failed bits exceeds the first state threshold, the memory block failure anticipation system 180 determines that a block level failure has occurred and the selected memory block is retired and/or marked as a grown bad block.

However, if the memory block failure anticipation system 180 determines that the number of failed bits does not exceed the first state threshold, the memory block failure anticipation system 180 compares the number of failed bits to a second state threshold. In an example, the second state threshold is a wordline level data loss threshold. In an example, the second state threshold is a failure rate of 56 bits/1 k sectors, although other thresholds may be used.

If the memory block failure anticipation system 180 determines that the number of failed bits is greater than the second state threshold (but less than the first state threshold), the memory block failure anticipation system 180 marks the first wordline as a failed wordline and retires the first wordline or otherwise marks the wordline as having grown bad. In an example, if a wordline has failed, the memory block failure anticipation system 180 may trigger a data recovery operation (e.g., a XOR recovery operation) to retrieve the data from the wordline and/or the memory block. When the data is recovered, the wordline and/or the memory block is marked as having grown bad.

However, if the memory block failure anticipation system 180 determines that the failed bit count is less than the second state threshold, the memory block failure anticipation system 180 selects a second wordline in the memory block and the operations are repeated until the memory block is marked as a grown bad and/or all of the wordlines of the memory block have been tested.

In some examples, it is possible that multiple wordlines of a memory block have been marked as grown bad, but the memory block itself is still functional. For example, a third wordline and a twentieth wordline of a memory block may have exceeded the second state threshold but not the first state threshold. In such examples, both wordlines are retired or marked as grown bad, but the memory block itself may still be functional. In other examples, the memory block may be retired if one or more of the wordlines are marked as having grown bad.

If the memory block passes the health check, the memory block may be used as normal. For example, the memory block can be used to store system level data and user data. In an example, the memory block failure anticipation system 180 also updates metadata 175 associated with the memory block to indicate the health of the memory block (e.g., the number of failed bits of the memory block), whether the memory block passed or failed the health check, and/or a timestamp (in terms of P/E cycles) indicating when the memory block underwent the health check.

Figure 3A:
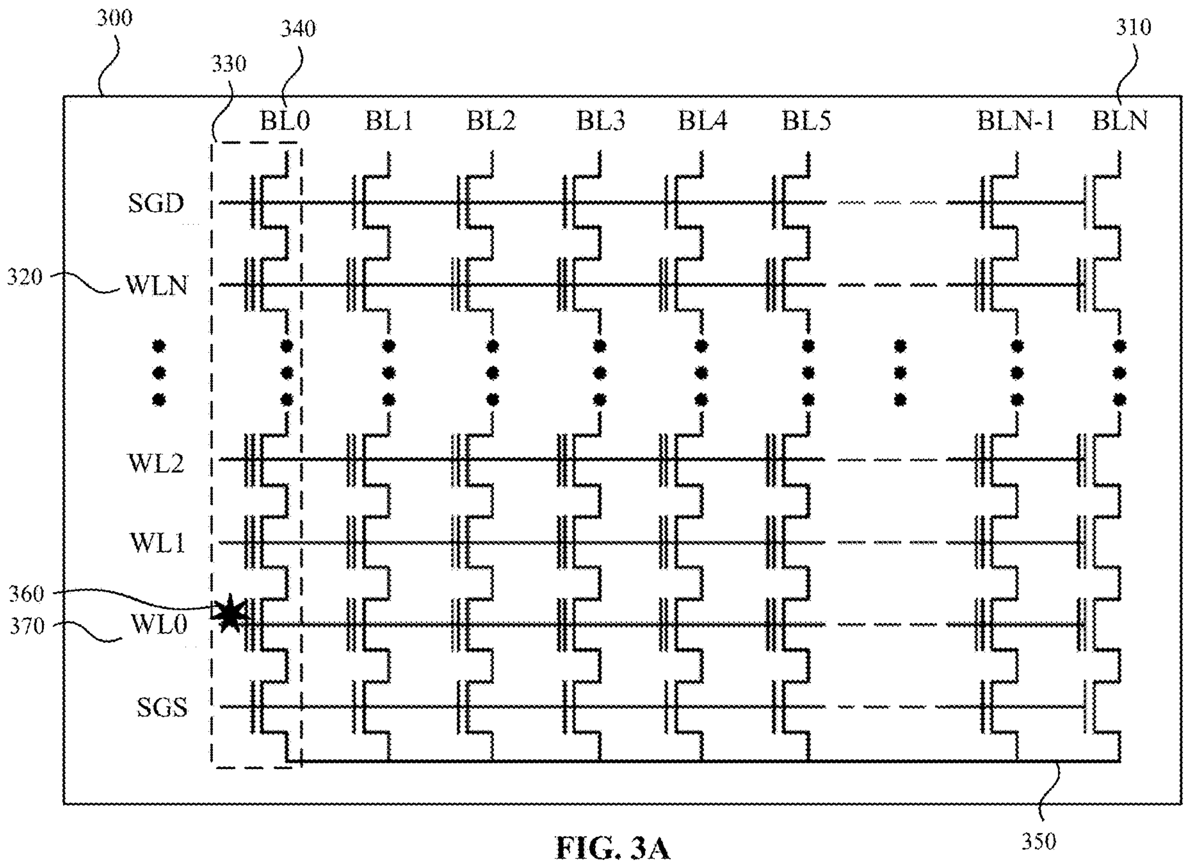
FIG. 3A illustrates a memory block having a wordline/NAND string leak according to an example.

FIG. 3A illustrates a memory block 300 having a wordline/NAND string leak according to an example. In an example, and if left unchecked or undetected, the wordline/NAND string leak may lead to a wordline/NAND string failure which may ultimately lead to data corruption and/or loss. In an example, the memory block 300 is similar to the memory block 225 shown and described with respect to FIG. 2C.

For example, the memory block 300 includes bit lines BL0-BLN (collectively bit lines 310), where N is a total number of bit lines. Additionally, the memory block 300 includes wordlines WL0-WLN (collectively wordlines 320), where N is a total number of wordlines. The memory block 300 also includes a number of NAND strings (e.g., NAND string 330) such as previously described. As shown in FIG. 3A, one terminal of the NAND string 330 is connected to bit line BL0 340 and another terminal of the NAND string 330 is connected to a source line 350.

In this example, the memory block 300 has been selected (e.g., by a controller 150 of a memory device 155 and/or by a memory block failure anticipation system 180 associated with the controller 150 (FIG. 1)) from a free memory block pool. Once selected, the memory block failure anticipation system determines a number of P/E cycles the memory block 300 has been subjected to. In this example, the memory block has been subjected to more than a threshold number of P/E cycles.

As such, the memory block failure anticipation system initiates an erase operation on the memory block 300. In response to the erase operation being completed, the memory block failure anticipation system initiates an open read sequence/command in which a read voltage is applied to the various wordlines of the memory block 300. As will be explained, any defects between contacts or connection points between a source line 350 and a memory hole may be detected by applying the read voltage such as described below.

As part of the read sequence, the memory block failure anticipation system selects a first wordline (e.g., wordline WL0 370) of the memory block 300 and determines the state of each memory cell associated with the wordline WL0 370. For example, the memory block failure anticipation system initiates a read command to determine the number of failed bits associated with the selected wordline.

In an example, the number of failed bits indicates a defect (e.g., a leak and/or a short) between the selected wordline and the NAND string. For example, the number of failed bits indicates a defect (e.g., a leak and/or a short) between the wordline WL0 370 and the NAND string 330.

In this example and as explained above, there is a defect (e.g., a leak and/or a short) (represented by the star 360 and referred to as wordline/NAND string defect (WL/NS defect)) between the NAND string 330 and wordline WL0 370. In response to detecting this failure, the memory block failure anticipation system compares determines the failed bit count associated with the wordline WL0 370 and compares the determined failed bit count to a first state threshold (e.g., a block level data loss threshold).

If the memory block failure anticipation system determines that the failed bit count associated with the wordline WL0 370 is above the first state threshold, the memory block failure anticipation system retires the memory block 300 and/or marks the memory block 300 as a grown bad block.

In this example, the failed bit count associated with the wordline WL0 370 is below the first state threshold. As a result, the memory block failure anticipation system proceeds with the health check and compares the failed bit count of the wordline WL0 370 to a second state threshold (e.g., a wordline level data loss threshold). If the memory block failure anticipation system determines that the failed bit count associated with the wordline WL0 370 is above the second state threshold, the memory block failure anticipation system retires wordline WL0 370 and/or marks the wordline as a grown bad wordline. In an example, the memory block 300 associated with WL0 370 may also be marked as grown bad and retired. In some examples, prior to retiring the memory block, or as part of the retirement process, any data stored in the memory block is retrieved, corrected and/or stored in another memory block.

However, in this example, the failed bit count of the wordline WL0 370 is below the second state threshold. As such, the memory block failure anticipation system selects the next wordline in the memory block 300 and the health check continues.

Figure 3B:
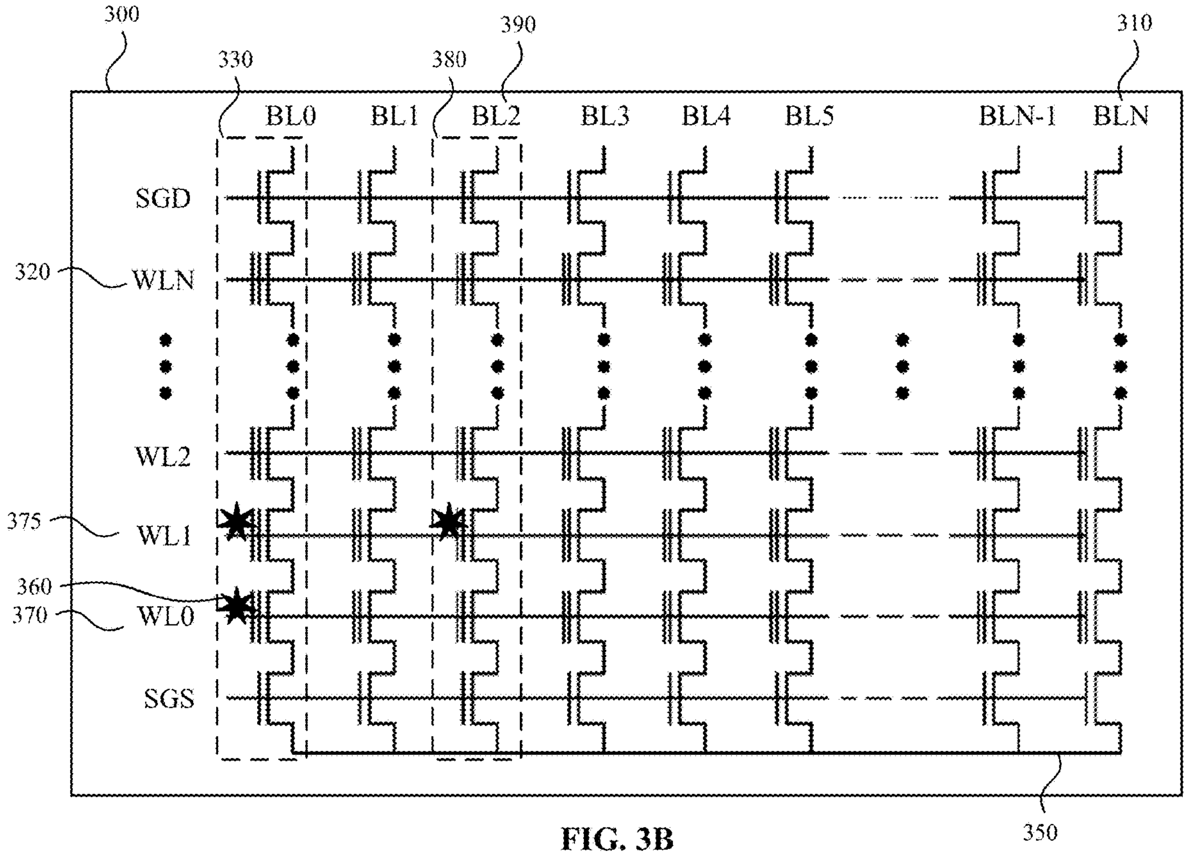
FIG. 3B illustrates the memory block of FIG. 3A having multiple wordline/NAND string leaks according to an example.

FIG. 3B illustrates the memory block 300 of FIG. 3A having multiple wordline/NAND string leaks according to an example. For example and as shown in FIG. 3B, the wordline WL1 375 has a first WL/NS defect between wordline WL1 375 and the first NAND string 330 and a second WL/NS defect between the wordline WL1 375 and a second NAND string 380. As shown in FIG. 3B, the second NAND string 380 is connected to the bit line BL2 390 and the source line 350.

In this example, the memory block failure anticipation system determines the state of each memory cell associated with the wordline WL1 375. For example, the memory block failure anticipation system determines that the two WL/NS defects result in a failed bit count of M. The memory block failure anticipation system compares the failed bit count M to the first state threshold and determines that M is below the first state threshold. As a result, the memory block failure anticipation system proceeds with the health check.

The memory block failure anticipation system then compares the failed bit count M to the second state threshold. In this example, the memory block failure anticipation system determines that M is greater than the second state threshold. As such, the memory block failure anticipation system retires the wordline WL1 375 and/or marks the wordline as a grown bad wordline. In an example, the memory block failure anticipation system may also mark the memory block 300 as grown bad and retire the memory block 300.

Figure 3C:
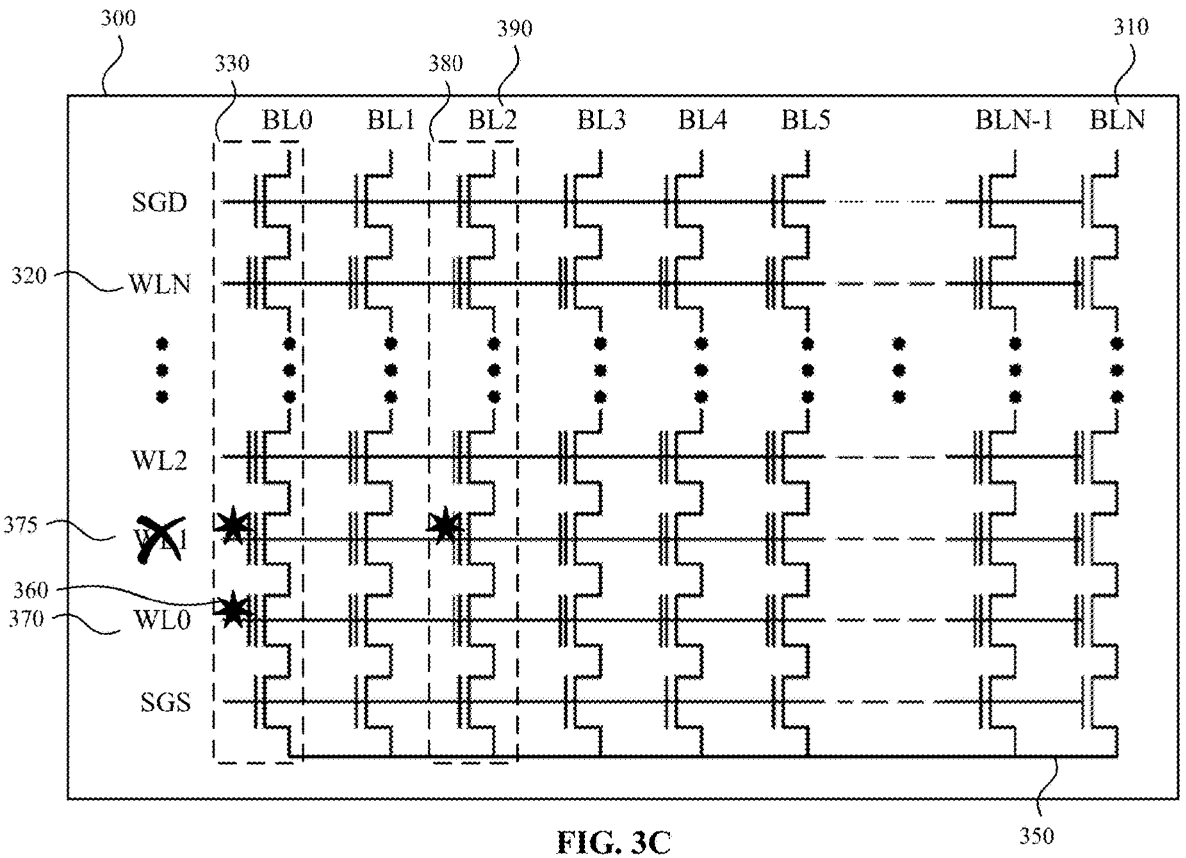
FIG. 3C illustrates how a memory block failure anticipation system marks a wordline as a grown bad wordline according to an example.

FIG. 3C illustrates how the memory block failure anticipation system marks a wordline as a grown bad wordline according to an example. For example and as shown in FIG. 3C, because the failed bit count associated with the wordline WL1 375 is above the second state threshold, the wordline has been marked as a grown bad wordline by the memory block failure anticipation system and is retired (indicated by the "X").

Figure 3D:
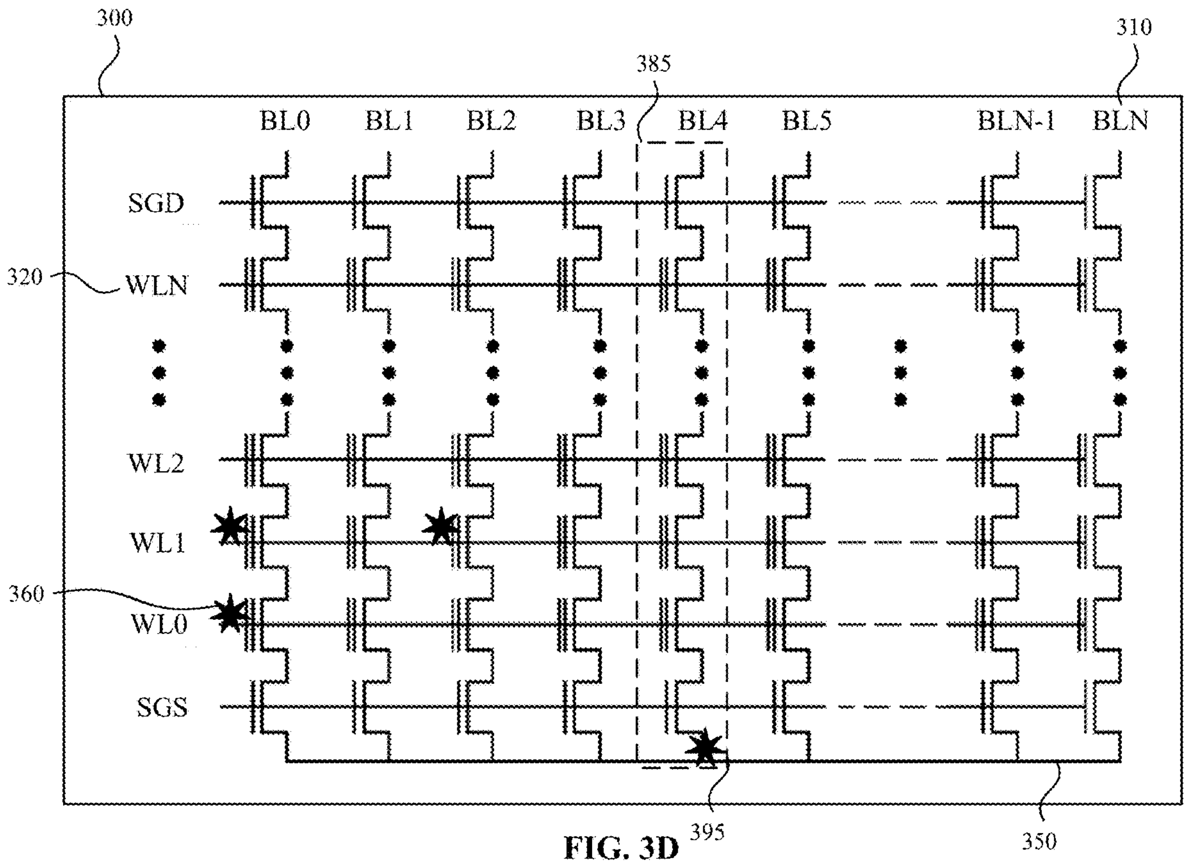
FIG. 3D illustrates the memory block of FIG. 3A having a source line/NAND string leak according to an example.

FIG. 3D illustrates the memory block of FIG. 3A having a source line/NAND string defect 395 according to an example. In this example, the memory block failure anticipation system detects the source line/NAND string defect 395 (referred to as a SL/NS defect) between the source line 350 and a third NAND string 385. In this example, the SL/NS defect 395 causes an entire channel of the memory block 300 to be open. As a result, none of the wordlines can be read using the read voltage. As such, a failed bit count of all of the wordlines of the memory block 300 exceeds the first state threshold. As a result, the memory block failure anticipation system retires the memory block 300 and/or marks the memory block 300 as a grown bad block.

Figure 4:
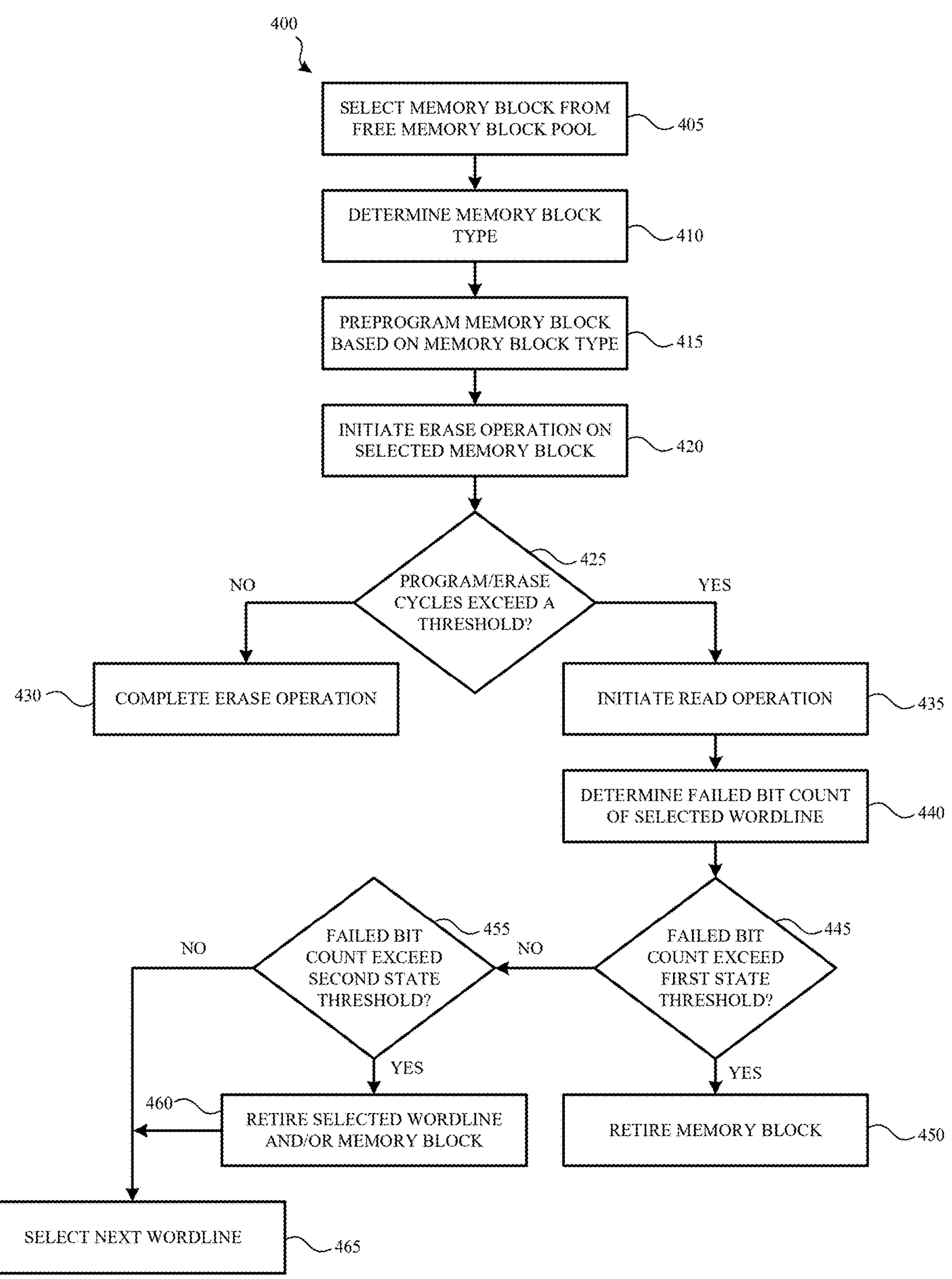
FIG. 4 illustrates a method for detecting defects in wordlines and/or memory blocks of a data storage device according to an example.

FIG. 4 illustrates a method 400 for detecting defects in wordlines and/or memory blocks of a data storage device according to an example. In an example, the method 400 is executed by a controller and/or a memory block failure anticipation system of a data storage device. For example, the method 400 is executed by the controller 150 and/or the memory block failure anticipation system 180 of the data storage device 110 shown and described with respect to FIG. 1.

In an example, the method 400 is usable to detect two different types of defects or failures that may occur in a memory block due to various stresses that occur as a result of P/E cycles or other stresses. For example, the method 400 is usable to check for data loss caused by failures between contacts between a wordline and a NAND string (referred to as wordline data loss) and/or data loss caused by failures between contacts between a source line and a NAND string (referred to as block level data loss).

The method 400 begins when the memory block failure anticipation system selects (405) a memory block from a free memory block pool. In an example, the free memory block pool is memory block pool that includes one or more memory blocks that are ready for an erase operation and/or are ready to have data stored thereon.

In response to the memory block being selected, the memory block failure anticipation system determines (410) a type of the memory block. For example, the memory block failure anticipation system determines (410) whether the memory block is a SLC memory block or a MLC memory block. The memory block failure anticipation system preprograms (415) the memory block with data and/or prefixes based, at least in part, on the determined type.

For example, if the memory block is a SLC memory block, the memory block failure anticipation system programs the memory block with a particular prefix (e.g., a A2h prefix). However, if the memory block failure anticipation system determines that the memory block is a MLC memory block, a prefix is not preprogramed to the memory block.

The memory block failure anticipation system then initiates (420) an erase operation on the selected memory block to set all of the memory cells to a desired state. For example, the erase command causes (or should cause) all memory cells in the memory block to store a logical "1". Before, after, or as part of the erase operation, the memory block failure anticipation system checks the number of P/E cycles the particular memory block has been subjected to and compares the number of P/E cycles to a threshold number of P/E cycles.

If the memory block failure anticipation system determines (425) that the selected memory block has been subjected to fewer than the threshold number of P/E cycles, the erase operation continues as normal and is ultimately completed (430). The method 400 may then be repeated with another memory block that is selected from the free memory block pool.

However, if the memory block failure anticipation system determines (425) that the memory block has been subjected to more than the threshold number of P/E cycles, the memory block failure anticipation system initiates (435) a read operation. In an example, the read operation is an open read sequence in which a read voltage (e.g., an eight volt read voltage) is applied to each wordline (in series or in sequence) of the memory block.

The memory block failure anticipation system then determines (440) a failed bit count (or determines a state of each memory cell) of a selected wordline of the memory block. For example, the memory block failure anticipation system performs a read command on the wordline to determine which memory cells associated with the wordline are storing a logical "1" and/or are storing a logical "0".

In an example, the memory block failure anticipation system then compares the failed bit count to a first state threshold to determine (445) whether the failed bit count exceeds the first state threshold. In an example, the first state threshold is a block level data loss threshold.

If the memory block failure anticipation system determines (445) that the failed bit count exceeds the first state threshold, the memory block failure anticipation system determines that a block level failure has occurred and the selected memory block is retired (450) and/or is marked as a grown bad block.

However, if the memory block failure anticipation system determines (445) that the failed bit count does not exceed the first state threshold, the memory block failure anticipation system compares the failed bit count to a second state threshold. In an example, the second state threshold is a wordline level data loss threshold.

In an example, if the memory block failure anticipation system determines (455) that the failed bit count is greater than the second state threshold (but less than the first state threshold), the memory block failure anticipation system marks the first wordline as a failed wordline and retires (460) the first wordline and/or the memory block associated with the first wordline. The memory block failure anticipate system then selects (465) the next wordline in the memory block and the method 400 is repeated.

However, if the memory block failure anticipation system determines that the failed bit count is less than the second state threshold, the memory block failure anticipation system selects (465) the next wordline in the memory block and the method 400 is repeated until all of the wordlines have been checked and/or until the memory block has been identified or marked as a grown bad block.

Figures 5, 6:
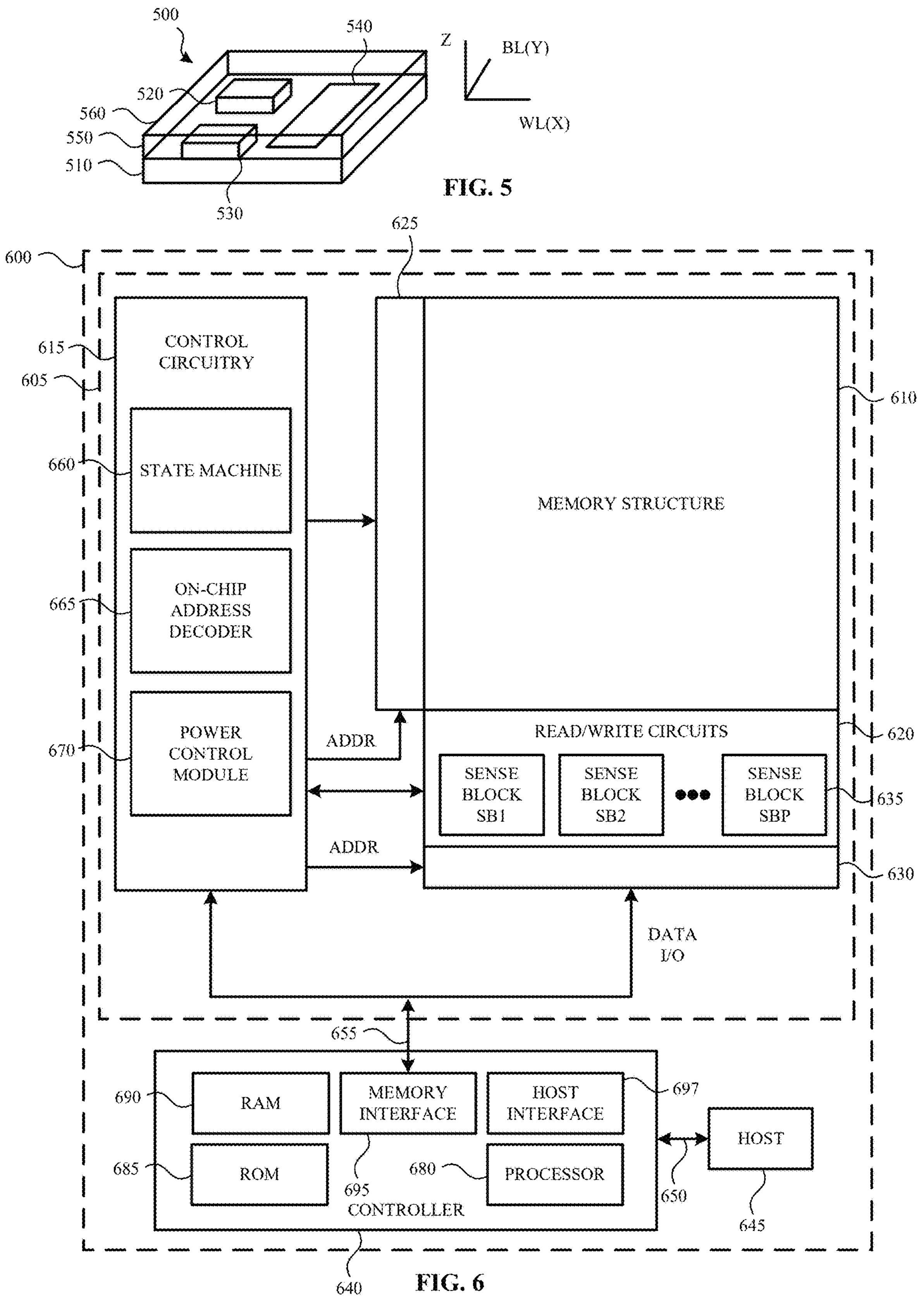
FIG. 5 is a perspective view of a storage device that includes three-dimensional (3D) stacked non-volatile memory according to an example.
FIG. 6 is a block diagram of a storage device according to an example.

FIG. 5-FIG. 6 describe example storage devices that may be used with or otherwise implement the various features described herein. For example, the storage devices shown and described with respect to FIG. 5-FIG. 6 may include various systems and components that are similar to the systems and components shown and described with respect to FIG. 1. For example, the controller 640 shown and described with respect to FIG. 6 may be similar to the controller 150 of FIG. 1. Likewise, the memory dies 605 may be similar to the first memory die 165 and/or the second memory die 170 of FIG. 1.

FIG. 5 is a perspective view of a storage device 500 that includes three-dimensional (3D) stacked non-volatile memory according to an example. In this example, the storage device 500 includes a substrate 510. Blocks of memory cells are included on or above the substrate 510. The blocks include a first block (BLK0 520) and a second block (BLK1 530). Each block is formed of memory cells (e.g., non-volatile memory elements). The substrate 510 also includes a peripheral area 540 having support circuits that are used by the first block and the second block.

The substrate 510 also carries circuits under the blocks, along with one or more lower metal layers which are patterned in conductive paths to carry signals from the circuits. In an example, the blocks are formed in an intermediate region 550 of the storage device 500. The storage device also includes an upper region 560. The upper region 560 includes one or more upper metal layers that are patterned in conductive paths to carry signals from the circuits. Each block of memory cells includes a stacked area of memory cells. In an example, alternating levels of the stack represent wordlines. While two blocks are depicted, additional blocks may be used and extend in the x-direction and/or the y-direction.

In an example, a length of a plane of the substrate 510 in the x-direction represents a direction in which signal paths for wordlines or control gate lines extend (e.g., a wordline or drain-end select gate (SGD) line direction) and the width of the plane of the substrate 510 in the y-direction represents a direction in which signal paths for bit lines extend (e.g., a bit line direction). The z-direction represents a height of the storage device 500.

FIG. 6 is a functional block diagram of a storage device 600 according to an example. In an example, the storage device 600 is similar to the 3D stacked non-volatile storage device 500 shown and described with respect to FIG. 5. In an example, the components depicted in FIG. 6 are electrical circuits. In an example, the storage device 600 includes one or more memory dies 605. Each memory die 605 includes a three-dimensional memory structure 610 of memory cells (e.g., a 3D array of memory cells), control circuitry 615, and read/write circuits 620. In another example, a two-dimensional array of memory cells may be used. The memory structure 610 is addressable by wordlines using a first decoder 625 (e.g., a row decoder) and by bit lines using a second decoder 630 (e.g., a column decoder). The read/write circuits 620 may also include multiple sense blocks 635 including SB1, SB2, . . . , SBp (e.g., sensing circuitry) which allow pages of the memory cells to be read or programmed in parallel. The sense blocks 635 may include bit line drivers.

In an example, a controller 640 is included in the same storage device 600 as the one or more memory dies 605. In another example, the controller 640 is formed on a die that is bonded to a memory die 605, in which case each memory die 605 may have its own controller 640. In yet another example, a controller die controls all of the memory dies 605. Although a single controller 640 is shown, the storage device 600 can include multiple controllers with each controller responsible for different operations described herein.

Commands and data are transferred between a host 645 and the controller 640 using a data bus 650. Additionally, commands and data are transferred between the controller 640 and one or more of the memory dies 605 by way of lines 655. In one example, the memory die 605 includes a set of input and/or output (I/O) pins that connect to lines 655.

The memory structure 610 also includes one or more arrays of memory cells. The memory cells are arranged in a three-dimensional array or a two-dimensional array. The memory structure 610 includes any type of non-volatile memory that is formed on one or more physical levels of arrays of memory cells having an active area disposed above a silicon substrate. The memory structure 610 may be in a non-volatile memory device having circuitry associated with the operation of the memory cells, whether the associated circuitry is above or within the substrate.

The control circuitry 615 works in conjunction with the read/write circuits 620 to perform memory operations (e.g., erase, program, read, and others) on the memory structure 610. The control circuitry 615 may include registers, ROM fuses, and other devices for storing default values such as base voltages and other parameters.

The control circuitry 615 also includes a state machine 660, an on-chip address decoder 665 and a power control module. The state machine 660 provides chip-level control of various memory operations, such as selecting a memory block for programming. The state machine 660 is programmable by software. In another example, the state machine 660 does not use software and is completely implemented in hardware (e.g., electrical circuits).

The on-chip address decoder 665 provides an address interface between addresses used by host 645 and/or the controller 640 to a hardware address used by the first decoder 625 and the second decoder 630. The power control module 670 controls power and voltages that are supplied to the wordlines and bit lines during memory operations. The power control module 670 may include drivers for wordline layers in a 3D configuration, select transistors (e.g., SGS and SGD transistors) and source lines. The power control module 670 may include one or more charge pumps for creating voltages. In an example, the power control module 670 helps ensure wordlines of the grown bad block described herein are programmed at the desired levels.

The control circuitry 615, the state machine 660, the on-chip address decoder 665, the first decoder 625, the second decoder 630, the power control module 670, the sense blocks 635, the read/write circuits 620, and/or the controller 640 may be considered one or more control circuits and/or a managing circuit that perform some or all of the operations described herein.

In an example, the controller 640, is an electrical circuit that may be on-chip or off-chip. Additionally, the controller 640 may include one or more processors 680, ROM 685, RAM 690, memory interface 695, and host interface 697, all of which may be interconnected. In an example, the one or more processors 680 is one example of a control circuit. Other examples can use state machines or other custom circuits designed to perform one or more functions. Devices such as ROM 685 and RAM 690 may include code such as a set of instructions. One or more of the processors 680 may be operable to execute the set of instructions to provide some or all of the functionality described herein.

Alternatively or additionally, one or more of the processors 680 may access code from a memory device in the memory structure 610, such as a reserved area of memory cells connected to one or more wordlines. The memory interface 695, in communication with ROM 685, RAM 690, and one or more of the processors 680, may be an electrical circuit that provides an electrical interface between the controller 640 and the memory die 605. For example, the memory interface 695 may change the format or timing of signals, provide a buffer, isolate from surges, latch I/O, and so forth.

The one or more processors 680 may issue commands to control circuitry 615, or any other component of memory die 605, using the memory interface 695. The host interface 697, in communication with the ROM 685, the RAM 690, and the one or more processors 680, may be an electrical circuit that provides an electrical interface between the controller 640 and the host 645. For example, the host interface 697 may change the format or timing of signals, provide a buffer, isolate from surges, latch I/O, and so on. Commands and data from the host 645 are received by the controller 640 by way of the host interface 697. Data sent to the host 645 may be transmitted using the data bus 650.

Multiple memory elements in the memory structure 610 may be configured so that they are connected in series or so that each element is individually accessible. By way of a non-limiting example, flash memory devices in a NAND configuration (e.g., NAND flash memory) typically contain memory elements connected in series. A NAND string is an example of a set of series-connected memory cells and select gate transistors.

A NAND flash memory array may also be configured so that the array includes multiple NAND strings. In an example, a NAND string includes multiple memory cells sharing a single bit line and are accessed as a group. Alternatively, memory elements may be configured so that each memory element is individually accessible (e.g., a NOR memory array). The NAND and NOR memory configurations are examples and memory cells may have other configurations.

The memory cells may be arranged in the single memory device level in an ordered array, such as in a plurality of rows and/or columns. However, the memory elements may be arrayed in non-regular or non-orthogonal configurations, or in structures not considered arrays.

In an example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, such as in the y direction) with each column having multiple memory cells. The vertical columns may be arranged in a two-dimensional arrangement of memory cells, with memory cells on multiple vertically stacked memory planes. Other configurations of memory elements in three dimensions can also constitute a 3D memory array.

In another example, in a 3D NAND memory array, the memory elements may be coupled together to form vertical NAND strings that traverse across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Based on the above, examples of the present disclosure describe a method, comprising: selecting a memory block from a pool of free memory blocks; initiating an erase operation on the memory block; determining whether a program/erase (P/E) cycle count for the memory block exceeds a P/E cycle threshold; in response to determining the P/E cycle count for the memory block exceeds the P/E cycle threshold: performing a read operation on a first wordline of a plurality of wordlines of the memory block; determining whether each memory cell associated with the first wordline is in a first state or a second state; determining whether a number of memory cells in the first state exceeds a first state threshold; in response to determining the number of memory cells in the first state exceeds the first state threshold, marking the memory block as a failed memory block; in response to determining the number of memory cells in the first state is less than the first state threshold, determining whether the number of memory cells in the first state exceeds a second state threshold; and in response to determining the number of memory cells in the first state exceeds the second state threshold, marking the first wordline as a failed wordline. In an example, the method also includes selecting a second wordline of the plurality of wordlines; determining whether each memory cell associated with the second wordline is in the first state or the second state; determining whether a number of memory cells of the second wordline in the first state and the number of memory cells of the first wordline in the first state exceeds the first state threshold; and in response to determining the number of memory cells of the second wordline in the first state and the number of memory cells of the first wordline in the first state exceeds the first state threshold, marking the memory block as a failed memory block. In an example, the method also includes in response to determining the number of memory cells of the second wordline in the first state and the number of memory cells of the first wordline in the first state is less than the first state threshold, determining whether the number of memory cells of the second wordline in the first state exceeds the second state threshold; and in response to determining the number of memory cells of the second wordline in the first state exceeds the second state threshold, marking the second wordline as a failed wordline. In an example, the method also includes determining whether the memory block is a single-level cell (SLC) memory block or a multi-level cell (MLC) memory block. In an example, the method also includes marking the memory block as a failed memory block in response to determining the number of memory cells in the first state exceeds the second state threshold. Ion an example, the P/E cycle threshold is based, at least in part, on an age of the memory block. In an example, determining whether each memory cell associated with the first wordline is in a first state or a second state is based, at least in part, on information received from a read command executed on the memory block.

Examples of the present disclosure also describe a data storage device, comprising: a controller; and a memory block failure anticipation system associated with the controller and operable to: initiate an erase operation on a selected memory block; determine whether a program/erase (P/E) cycle count for the selected memory block exceeds a P/E cycle threshold; in response to a determination that the P/E cycle count for the selected memory block exceeds the P/E cycle threshold: determine whether each memory cell associated with a first wordline of the selected memory block is in a first state; determine whether a number of memory cells associated with the first wordline of the selected memory block in the first state exceeds a first state threshold; in response to a determination that the number of memory cells associated with the first wordline of the selected memory block in the first state exceeds the first state threshold, mark the selected memory block as a failed memory block; in response to a determination that the number of memory cells associated with the first wordline of the selected memory block in the first state is less than the first state threshold, determine whether the number of memory cells associated with the first wordline of the selected memory block in the first state exceeds a second state threshold; and in response to a determination that the number of memory cells associated with the first wordline of the selected memory block in the first state exceeds the second state threshold, mark the first wordline as a failed wordline. In an example, the memory block failure anticipation system executes a read operation on the first wordline of the selected memory block to determine whether each memory cell associated with the first wordline of the selected memory block is in the first state. In an example, the memory block failure anticipation system is further operable to: determine whether each memory cell associated with a second wordline of the selected memory block is in the first state; determine whether a number of memory cells associated with the second wordline in the first state and the number of memory cells associated with the first wordline in the first state exceeds the first state threshold; and in response to a determination that the number of memory cells associated with the second wordline in the first state and the number of memory cells associated with the first wordline in the first state exceeds the first state threshold, mark the selected memory block as a failed memory block. In an example, the memory block failure anticipation system is further operable to: determine whether the number of memory cells associated with the second wordline in the first state exceeds the second state threshold; and in response to a determination that the number of memory cells associated with the second wordline in the first state exceeds the second state threshold, mark the second wordline as a failed wordline. In an example, the memory block failure anticipation system determines whether the number of memory cells associated with the second wordline in the first state exceeds the second state threshold in response to determining the number of memory cells associated with the second wordline in the first state and the number of memory cells associated with the first wordline in the first state is less than the first state threshold. In an example, the P/E cycle threshold is based, at least in part, on an age of at least one of the selected memory block and the data storage device. In an example, the memory block failure anticipation system executed a read command on the selected memory block to determine whether each memory cell associated with the first wordline is in the first state.

Examples also describe a data storage device, comprising: means for determining whether a program/erase (P/E) cycle count for a memory block selected for an erase operation exceeds a P/E cycle threshold; means for determining whether each memory cell associated with a first wordline of the selected memory block is in a first state; means for determining whether a number of memory cells associated with the first wordline of the selected memory block in the first state exceeds a first state threshold; means for marking the selected memory block as a failed memory block in response to a determination that the P/E cycle count for the selected memory block exceeds the P/E cycle threshold; means for determining whether the number of memory cells associated with the first wordline of the selected memory block in the first state exceeds a second state threshold; and means for marking the first wordline as a failed wordline in response to a determination that the number of memory cells associated with the first wordline of the selected memory block in the first state exceeds the second state threshold. In an example, the data storage device also includes means for determining whether each memory cell associated with a second wordline of the selected memory block is in the first state; means for determining whether a number of memory cells associated with the second wordline in the first state and the number of memory cells associated with the first wordline in the first state exceeds the first state threshold; and means for marking the selected memory block as a failed memory block in response to a determination that the number of memory cells associated with the second wordline in the first state and the number of memory cells associated with the first wordline in the first state exceeds the first state threshold. In an example, the data storage device also includes means for determining whether the number of memory cells associated with the second wordline in the first state exceeds the second state threshold; and means for marking the second wordline as a failed wordline in response to a determination that the number of memory cells associated with the second wordline in the first state exceeds the second state threshold. In an example, the means for determining whether the number of memory cells associated with the second wordline in the first state exceeds the second state threshold makes the determination in response to a determination that the number of memory cells associated with the second wordline in the first state and the number of memory cells associated with the first wordline in the first state is less than the first state threshold. In an example, the P/E cycle threshold is based, at least in part, on an age of at least one of a selected memory block and the data storage device. In an example, the memory block is selected from a pool of free memory blocks.

One of ordinary skill in the art will recognize that the technology described herein is not limited to a single specific memory structure, but covers many relevant memory structures within the spirit and scope of the technology as described herein and as understood by one of ordinary skill in the art.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present disclosure, one skilled in the art may envision variations, modifications, and alternate aspects falling within the spirit of the broader aspects of the general inventive concept embodied in this disclosure that do not depart from the broader scope of the claimed disclosure.

Aspects of the present disclosure have been described above with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A method, comprising:
selecting a memory block from a pool of free memory blocks;
initiating an erase operation on the memory block;
determining whether a program/erase (P/E) cycle count for the memory block exceeds a P/E cycle threshold;
in response to determining the P/E cycle count for the memory block exceeds the P/E cycle threshold:
performing a read operation on a first wordline of a plurality of wordlines of the memory block;
determining whether each memory cell associated with the first wordline is in a first state or a second state;
determining whether a number of memory cells in the first state exceeds a first state threshold;
in response to determining the number of memory cells in the first state exceeds the first state threshold, marking the memory block as a failed memory block;
in response to determining the number of memory cells in the first state is less than the first state threshold, determining whether the number of memory cells in the first state exceeds a second state threshold; and
in response to determining the number of memory cells in the first state exceeds the second state threshold, marking the first wordline as a failed wordline.

2. The method of claim 1, further comprising:
selecting a second wordline of the plurality of wordlines;
determining whether each memory cell associated with the second wordline is in the first state or the second state;
determining whether a number of memory cells of the second wordline in the first state and the number of memory cells of the first wordline in the first state exceeds the first state threshold; and
in response to determining the number of memory cells of the second wordline in the first state and the number of memory cells of the first wordline in the first state exceeds the first state threshold, marking the memory block as a failed memory block.

3. The method of claim 2, further comprising:
in response to determining the number of memory cells of the second wordline in the first state and the number of memory cells of the first wordline in the first state is less than the first state threshold, determining whether the number of memory cells of the second wordline in the first state exceeds the second state threshold; and
in response to determining the number of memory cells of the second wordline in the first state exceeds the second state threshold, marking the second wordline as a failed wordline.

4. The method of claim 1, further comprising determining whether the memory block is a single-level cell (SLC) memory block or a multi-level cell (MLC) memory block.

5. The method of claim 1, further comprising marking the memory block as a failed memory block in response to determining the number of memory cells in the first state exceeds the second state threshold.

6. The method of claim 1, wherein the P/E cycle threshold is based, at least in part, on an age of the memory block.

7. The method of claim 1, wherein determining whether each memory cell associated with the first wordline is in a first state or a second state is based, at least in part, on information received from a read command executed on the memory block.

8. A data storage device, comprising:
a controller; and
a memory block failure anticipation system associated with the controller and operable to:
initiate an erase operation on a selected memory block;
determine whether a program/erase (P/E) cycle count for the selected memory block exceeds a P/E cycle threshold;
in response to a determination that the P/E cycle count for the selected memory block exceeds the P/E cycle threshold:
determine whether each memory cell associated with a first wordline of the selected memory block is in a first state;
determine whether a number of memory cells associated with the first wordline of the selected memory block in the first state exceeds a first state threshold;
in response to a determination that the number of memory cells associated with the first wordline of the selected memory block in the first state exceeds the first state threshold, mark the selected memory block as a failed memory block;
in response to a determination that the number of memory cells associated with the first wordline of the selected memory block in the first state is less than the first state threshold, determine whether the number of memory cells associated with the first wordline of the selected memory block in the first state exceeds a second state threshold; and
in response to a determination that the number of memory cells associated with the first wordline of the selected memory block in the first state exceeds the second state threshold, mark the first wordline as a failed wordline.

9. The data storage device of claim 8, wherein the memory block failure anticipation system executes a read operation on the first wordline of the selected memory block to determine whether each memory cell associated with the first wordline of the selected memory block is in the first state.

10. The data storage device of claim 8, wherein the memory block failure anticipation system is further operable to:
determine whether each memory cell associated with a second wordline of the selected memory block is in the first state;
determine whether a number of memory cells associated with the second wordline in the first state and the number of memory cells associated with the first wordline in the first state exceeds the first state threshold; and
in response to a determination that the number of memory cells associated with the second wordline in the first state and the number of memory cells associated with the first wordline in the first state exceeds the first state threshold, mark the selected memory block as a failed memory block.

11. The data storage device of claim 10, wherein the memory block failure anticipation system is further operable to:
determine whether the number of memory cells associated with the second wordline in the first state exceeds the second state threshold; and
in response to a determination that the number of memory cells associated with the second wordline in the first state exceeds the second state threshold, mark the second wordline as a failed wordline.

12. The data storage device of claim 11, wherein the memory block failure anticipation system determines whether the number of memory cells associated with the second wordline in the first state exceeds the second state threshold in response to determining the number of memory cells associated with the second wordline in the first state and the number of memory cells associated with the first wordline in the first state is less than the first state threshold.

13. The data storage device of claim 8, wherein the P/E cycle threshold is based, at least in part, on an age of at least one of the selected memory block and the data storage device.

14. The data storage device of claim 8, wherein the memory block failure anticipation system executed a read command on the selected memory block to determine whether each memory cell associated with the first wordline is in the first state.

15. A data storage device, comprising:
means for determining whether a program/erase (P/E) cycle count for a memory block selected for an erase operation exceeds a P/E cycle threshold;
means for determining whether each memory cell associated with a first wordline of the selected memory block is in a first state;
means for determining whether a number of memory cells associated with the first wordline of the selected memory block in the first state exceeds a first state threshold;
means for marking the selected memory block as a failed memory block in response to a determination that the P/E cycle count for the selected memory block exceeds the P/E cycle threshold;
means for determining whether the number of memory cells associated with the first wordline of the selected memory block in the first state exceeds a second state threshold; and
means for marking the first wordline as a failed wordline in response to a determination that the number of memory cells associated with the first wordline of the selected memory block in the first state exceeds the second state threshold.

16. The data storage device of claim 15, further comprising:
means for determining whether each memory cell associated with a second wordline of the selected memory block is in the first state;
means for determining whether a number of memory cells associated with the second wordline in the first state and the number of memory cells associated with the first wordline in the first state exceeds the first state threshold; and
means for marking the selected memory block as a failed memory block in response to a determination that the number of memory cells associated with the second wordline in the first state and the number of memory cells associated with the first wordline in the first state exceeds the first state threshold.

17. The data storage device of claim 16, further comprising:

means for determining whether the number of memory cells associated with the second wordline in the first state exceeds the second state threshold; and means for marking the second wordline as a failed wordline in response to a determination that the number of memory cells associated with the second wordline in the first state exceeds the second state threshold.

18. The data storage device of claim 17, wherein the means for determining whether the number of memory cells associated with the second wordline in the first state exceeds the second state threshold makes the determination in response to a determination that the number of memory cells associated with the second wordline in the first state and the number of memory cells associated with the first wordline in the first state is less than the first state threshold.

19. The data storage device of claim 15, wherein the P/E cycle threshold is based, at least in part, on an age of at least one of a selected memory block and the data storage device.

20. The data storage device of claim 15, wherein the memory block is selected from a pool of free memory blocks.

* * * * *